（12）United States Patent
Gilbert

(10) Patent No.: US 7,038,608 B1
(45) Date of Patent: May 2, 2006

(54) DIGITAL TO ANALOG CONVERTER

(75) Inventor: Michael J. Gilbert, Westford, MA (US)

(73) Assignee: Valeo Raytheon Systems, Inc., Hudson, NH (US)

( * ) Notice: Subject to any disclaimer, the term of this patent is extended or adjusted under 35 U.S.C. 154(b) by 0 days.

(21) Appl. No.: 11/013,950

(22) Filed: Dec. 16, 2004

(51) Int. Cl.
H03M 1/66 (2006.01)

(52) U.S. Cl. ........................... 341/144; 341/145
(58) Field of Classification Search ............ 341/144, 341/145, 143, 164, 165, 162

See application file for complete search history.

(56) References Cited

U.S. PATENT DOCUMENTS 5,727,023 A * 3/1998 Dent ..................... 375/244
6,864,699 B1 * 3/2005 Sakayori et al. ......... 324/763

2004/0208249 A1 * 10/2004 Risbo et al. ............ 375/243

* cited by examiner

Primary Examiner—John B Nguyen
(74) Attorney, Agent, or Firm—Daly, Crowley, Mofford & Durkee, LLP

(57) ABSTRACT

A digital to analog converter includes a digital processor having an input port adapted to receive an input signal and an output port coupled to an input port of an analog filter wherein the digital processor includes a digital feedback loop which compares a reference digital voltage with a digital voltage provided by a digital model of the analog filter. Using a completely digital feedback loop which compares an input digital voltage with the digital voltage from the digital model of the analog filter results in a single bit digital to analog converter having improved accuracy for a given clock rate and filter. The next digital state of the converter (i.e. '0' or '1') is selected based upon a comparison of the input (or reference) voltage with the digital voltage provided by the digital feedback loop. The digital converter output is then fed to the analog filter. If the analog filter matches the digital model, then the analog voltage will match the digital voltage, and therefore the reference voltage.

14 Claims, 4 Drawing Sheets

DIGITAL TO ANALOG CONVERTER

CROSS-REFERENCE TO RELATED APPLICATIONS

Not applicable.

STATEMENTS REGARDING FEDERALLY SPONSORED RESEARCH

Not applicable.

FIELD OF THE INVENTION

This invention relates generally to radar systems and more particularly to techniques for generating an analog waveform to modulate a radio frequency (RF) signal for use in radar systems.

BACKGROUND OF THE INVENTION

As is known in the art, radar systems often utilize a radio frequency (RF) signal modulated by an analog waveform. Although it is desirable to provide relatively accurate analog waveforms, it is also sometimes desirable to provide low cost systems. Thus, in such relatively low cost systems, single bit conversion is typically used to generate a desired analog waveform.

As is also known, conventional single bit converters typically use Pulse Width Modulation (PWM) or Delta Sigma Modulation (DSM). PWM converters generate pulses at a fixed frequency. The pulses have a pulse width which is proportional to the desired output voltage. The switching noise generated by this converter contains low frequencies, which are difficult to filter. Thus, while PWM converters are relatively simple and inexpensive, they also do not provide a suitable level of accuracy for many applications.

DSM converters are more sophisticated than PWM converters. DSM converters typically utilize a digital feedback arrangement to shift the switching noise higher in frequency, where it can more easily be filtered. Thus, while DSM converter techniques typically provide a desired level of accuracy, they are relatively sophisticated and thus relatively expensive. They also typically require a relatively high clock rate.

SUMMARY OF THE INVENTION

In accordance with the present invention, a digital to analog converter (DAC) includes a digital processor having an input port adapted to receive a digital input signal and an output port coupled to an input port of an analog filter having a desired filter characteristic. The analog filter has an oupout port at which an output analog signal is provided. The digital processor includes a digital feedback loop provided from a comparator and a digital model of an analog filter. An output of the digital model of the analog filter is coupled to the second input port of the comparator to provide a feedback signal to the comparator.

With this particular arrangement, a DAC having improved accuracy for a given clock rate and a given analog filter is provided. The comparator provides an output signal having a value dependent upon the values of the input signal and the feedback signal provided by the digital model of the analog filter. By providing the DAC with a digital feedback loop which includes a digital implementation (e.g. a digital model) of an analog filter and a comparator which compares the value of a digital input (or reference) signal to the value of the signal from the digital model of the analog filter, a DAC having a decreased amount of noise and an improved transient response is provided. By adding the digital model of the analog filter to the feedback loop, the digital processor is provided having a high pass filter characteristic. This approach reduces the amount of noise in the DAC. By matching the filter characteristics provided by the digital model of the analog filter to the filter characteristics of the analog filter, the transient response characteristics of the analog filter are reduced. Thus, the digital modeling of the analog filter improves the overall performance of the DAC. In one embodiment, the DAC is provided as a relatively low-cost, accurate, single bit DAC used in an automotive radar system. It should be appreciated that the general function provided by the comparator (i.e. comparing the value of the feedback signal to the value of the digital input signal and proving an output value based upon which is larger) can be also be accomplished by utilizing a subtractor circuit and a quantizer circuit.

In accordance with a further aspect of the present invention, a method for processing radar signals includes providing a digital input signal to a first input of a comparator, providing a digital feedback signal to a second input of the comparator with the digital feedback signal corresponding to an output signal provided by a digital model of an analog filter, comparing the digital input signal to the digital feedback signal and providing a digital output signal from the output of the comparator to an input of an analog filter having filter characteristics corresponding to the filter characteristics represented by the digital model of an analog filter.

With this particular arrangement, a technique for providing an analog waveform for modulating RF signals is provided. By providing a digital model of the analog filter in a feedback loop and by matching the digital filter characteristics of the model to the filter characteristics of the analog filter, a digital to analog converter which decreases the amount of noise and improves transient response is provided. The amount of noise is decreased because by adding the filter to the feedback loop, a processor is provided having a high pass filter characteristic. Thus, by including a digital model of an analog filter in a digital feedback loop with a comparator, DACs operating in accordance with the technique can provide relatively accurate waveforms which are suitable for use with RF signals in radar systems, including but not limited to automotive radar systems. It should be appreciated that the compare operation (i.e. comparing the value of the feedback signal to the value of the digital input signal and proving an output value based upon which is larger) can be also be accomplished by utilizing a subtractor and a quantizer circuit.

BRIEF DESCRIPTION OF THE DRAWINGS

The foregoing features of this invention, as well as the invention itself, may be more fully understood from the following description of the drawings in which.

DETAILED DESCRIPTION

Figure 1:
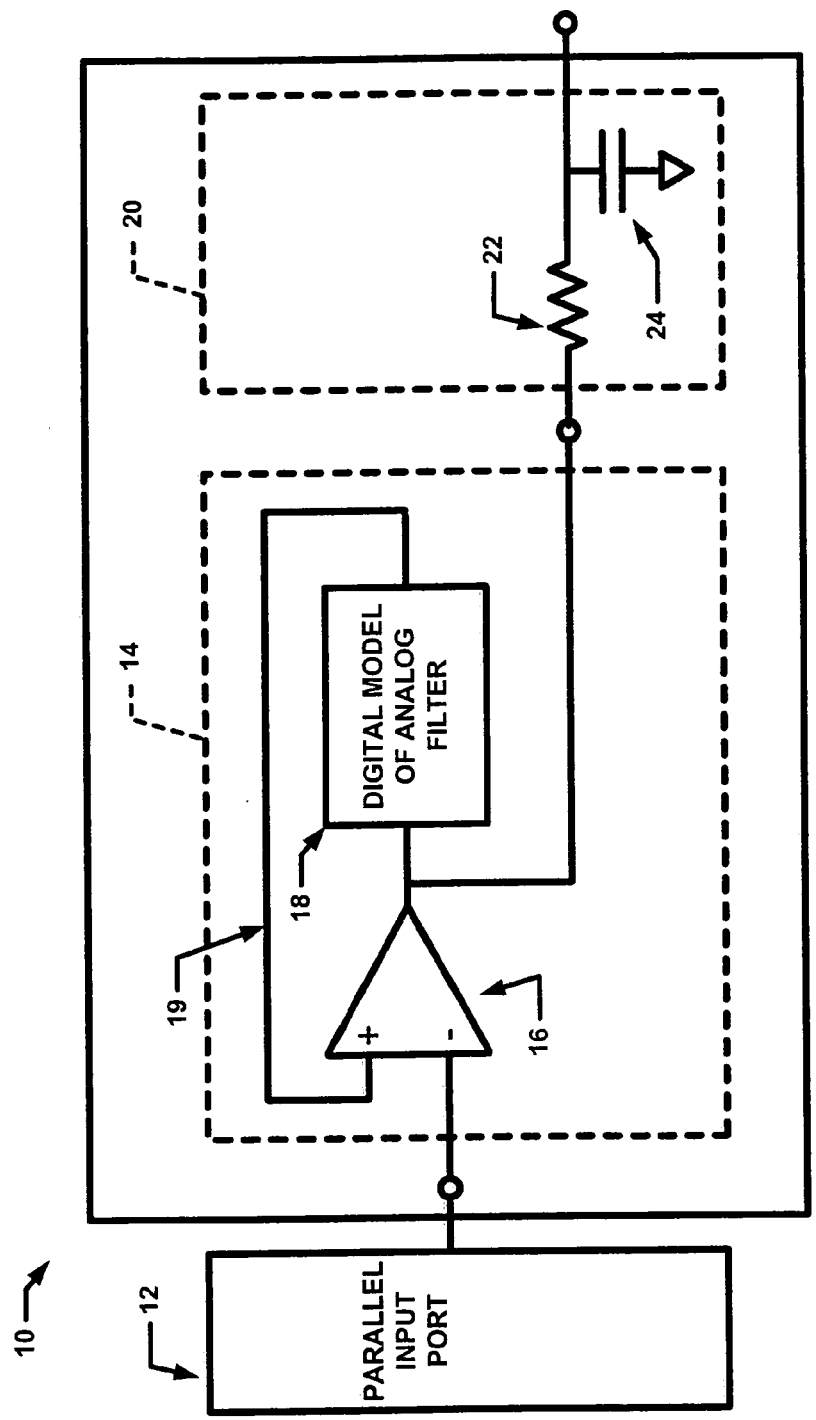
FIG. 1 is a block diagram of a digital to analog converter (DAC)

Referring now to FIG. 1, a single bit digital-to-analog converter (DAC) 10 has an input port 10a, here provided as a parallel input port adapted to receive a digital input signal and an output port 10b at which an analog output signal is provided. The DAC 10 includes a digital processor 14.

The digital processor 14 includes one or more digital processing elements which may be implemented using a variety of different techniques including but not limited to as a plurality of logic gates, as an application specific integrated circuit (ASIC), as a field programmable gate array (FPGA) or as a microprocessor.

The digital processor 14 is programmed or otherwise provided to implement a comparator 16 and a filter 18 (also referred to herein as a "digital model of an analog filter" or more simply as a "digital filter" or a "digital implementation of a filter"). The phrase digital model of an analog filter, or any variant thereof, is intended to cover any discrete time model or discrete value model or implementation of a continuous system such as the analog filter. A first port 16a of the comparator 16 is coupled to receive an input signal from the input port 10a and an output port 16b of the comparator is coupled to an input 18a of the digital filter 18.

The comparator controls the digital output at output port 16b so as to minimize the difference between the input (or reference) signal at comparator port 16a and the modeled or feedback signal at comparator port 16b. In this particular embodiment, the input and feedback signals correspond to voltage signals but in other embodiments, it may be desirable or convenient to provide the input and feedback signals as signals other than voltage signals (e.g. as current or mixed signals).

The digital output is a stream of digital bits (i.e. a series of logical one's and zero's). In this particular embodiment, the fraction of logical one's in the output bit stream is proportional to the strength of the reference signal. It should be appreciated of course, that in other embodiments, it may be desirable to provide the system such that the fraction of zeros in the output bit stream is proportional to the reference signal.

The output of the comparator 16 is also provided to an analog filter 20 at an input port 20a. In this example, the analog filter is provided from a series resister 22 and a shunt capacitor 24 coupled to provide a low pass filter characteristic.

Filter 20 filters the output signal which represents the out bit stream so that the signal level of the analog output signal at port 10b is proportional to the reference signal. In this exemplary embodiment, the output signal corresponds to an output signal voltage which is filtered by the resistor 22 and the capacitor 24 so that the output analog voltage at port 10b is proportional to the reference voltage.

The filter characteristics of the digital filter 18 are selected to substantially match the filter characteristics of the analog filter 20 at least in the frequency range of interest. For example, if the analog filter is provided having a bandpass filter characteristic, then the frequency range of interest would generally be in the frequency range of the passband and possibly somewhat slightly outside the passband. Similarly, if the analog filter is provided having a low pass filter characteristic, then the frequency range of interest would generally be in the frequency range of the passband of the low pass filter and possibly somewhat slightly outside the passband. Similarly again, if the analog filter is provided having a high pass filter characteristic, then the frequency range of interest would generally be in the frequency range of the passband of the high pass filter and possibly somewhat slightly outside the passband.

It should also be appreciated, however, that in some embodiments, it may be desirable to substantially match the filter characteristics of the analog filter over an entire frequency range which extends beyond the operational frequency range of the filter. The output of the digital model of the analog filter 18 is provided to a second input-port 16c of the comparator 16.

In the embodiment shown in FIG. 1, the analog filter 20 is provided as a low pass filter from the resister 22 and the capacitor 24. Thus, the digital model of the filter 18 is also provided having a low pass filter characteristic so as to match the filter characteristic of the low pass filter 20.

The filter characteristics of the analog filter 20 are selected based upon desired system performance characteristics. The selection of particular characteristics for filter 20 typically involves a trade-off between the amount of noise which is desired to be eliminated from the system and the cut-off frequency ($f_c$). The cut-off frequency $f_c$ is typically selected as a frequency which allows a desired signal to pass but rejects as much noise as possible.

It should be appreciated that the filter 22 could also be provided as a multi-pole filter. In some applications, it may be desirable to provide the filter 20 having filter characteristics other than low pass filter characteristics. Such filter characteristics include but are not limited to band pass filter characteristics, high pass filter characteristics or any other filter characteristics which would be beneficial for use in any particular application.

The output of the digital model of the analog filter 18 is provided as a feedback signal to an input 16c of the comparator 18. It should be appreciated that since the input signal fed to the comparator input 16 is a parallel port, the feedback signal provided from the filter is also provided as a parallel signal having the same number of bits as the input signal provided to comparator input port 16a. It should also be appreciated that there is no limit (other than manufacturing limitations) on the number of bits which may be provided at the parallel input port 10a or at the comparator port 16a or at the comparator input port 16c.

It should be appreciated that the general function provided by the comparator (i.e. comparing the value of the feedback signal to the value of the digital input signal and proving an output value based upon which is larger) can be also be accomplished by utilizing a subtractor circuit and a quantizer circuit rather than a digital comparator circuit.

Figure 2:
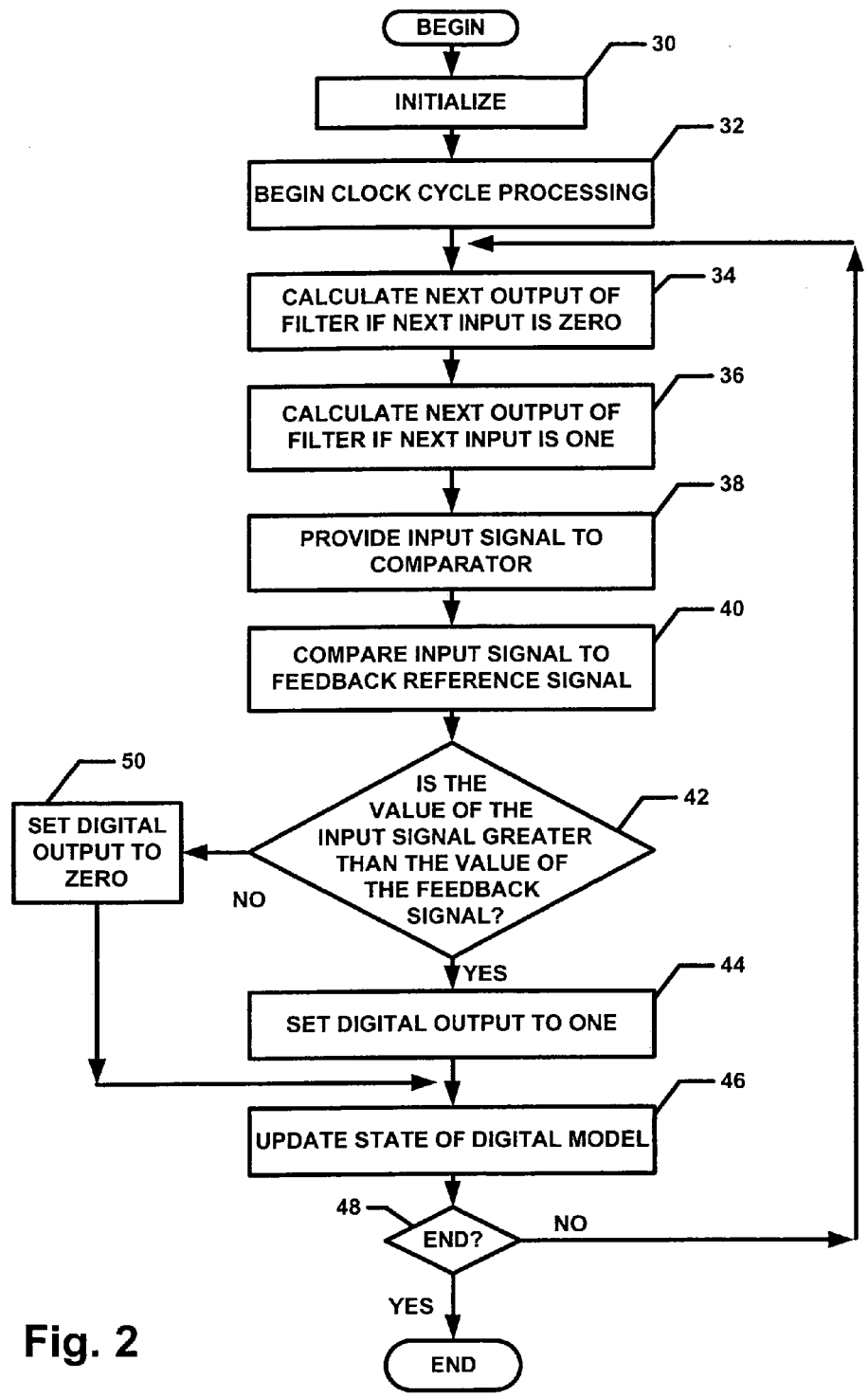
FIG. 2 is a flow diagram of the processing performed by a digital to analog converter (DAC)

FIG. 2 is a flow diagram which illustrates the processing performed by a DAC processor to provide an analog signal at the output port of the DAC. The rectangular elements in the flow diagram (e.g. block 30) are herein denoted "processing blocks" and represent steps, instructions, groups of instructions or operations. Some of the processing blocks can represent an empirical procedure or a database operation while others can represent computer software instructions or groups of instructions. The diamond shaped elements in the flow diagram (e.g. block 42) are herein denoted "decision blocks" and represent steps, operations or instructions or groups of instructions which affect the processing of the processing blocks. Thus, some of the processes described in the flow diagram may be implemented via computer software while others may be implemented in a different manner.

Alternatively, some of the processing blocks can represent operations or processes performed by functionally equivalent circuits including but not limited to circuits such as an application specific integrated circuit (ASIC), a field programmable gate array (FPGA), or a plurality of logic gates. The flow diagram does not depict the syntax of any particular programming language. Rather, the flow diagram illustrates the functional information one of ordinary skill in the art requires to perform the operations or to fabricate circuits or to generate computer software to perform the processing required of the particular apparatus. It should be noted that where computer software can be used, many routine program elements, such as initialization of loops and variables and the use of temporary variables are not shown. It will be appreciated by those of ordinary skill in the art that unless otherwise indicated herein, the particular sequence of steps and operations described is illustrative only and can be varied without departing from the spirit of the invention.

Turning now to FIG. 2, processing begins with an initialization process as shown in processing block 30 and processing then proceeds to processing block 32 in which the processing for a single clock cycle begins. In processing blocks 34 and 36, the next output of a digital filter is computed based upon various inputs to the filter. In particular, in processing block 34 the next output of the filter is computed based upon the condition that the next filter input is a first logic level (e.g. a logic zero signal level) and, similarly, in processing block 36 a calculation is made for the output of the filter based upon the condition that the next filter input is a second different logic level (e.g. a logic one signal level).

Processing then proceeds to processing block 38 in which an input signal is provided to an input of a comparator portion of the digital processor. Once the input signal is provided to the comparator, then processing proceeds to block 40 in which the comparator compares the input signal to a feedback reference signal provided from the output of the digital filter.

In decision block 42, a decision is made as to whether the value of the input signal provided to the comparator is greater that the value of the feedback signal provided to the comparator. If the value of the input signal is greater that the feedback signal, the processing proceeds to block 44 and the digital output is set to a first logic level (e.g. a logical one).

If in decision block 42 a decision was made that the value of the input signal was not greater than the value of the feedback signal, then processing proceeds to processing block 45 and the digital output is set to a second logic level (e.g. a logical zero).

Regardless of whether the digital output is set to a logic one or a logic zero, processing proceeds to processing block 46 in which the state of the digital model is updated and then to decision block 48 in which a decision is made as to whether there are more cycles to process or whether processing should end. If more cycles remain to be processed, then processing flows back to processing block 34 and steps 34–46 are repeated. If no more cycles remain to be processed, then processing ends.

Figure 3:
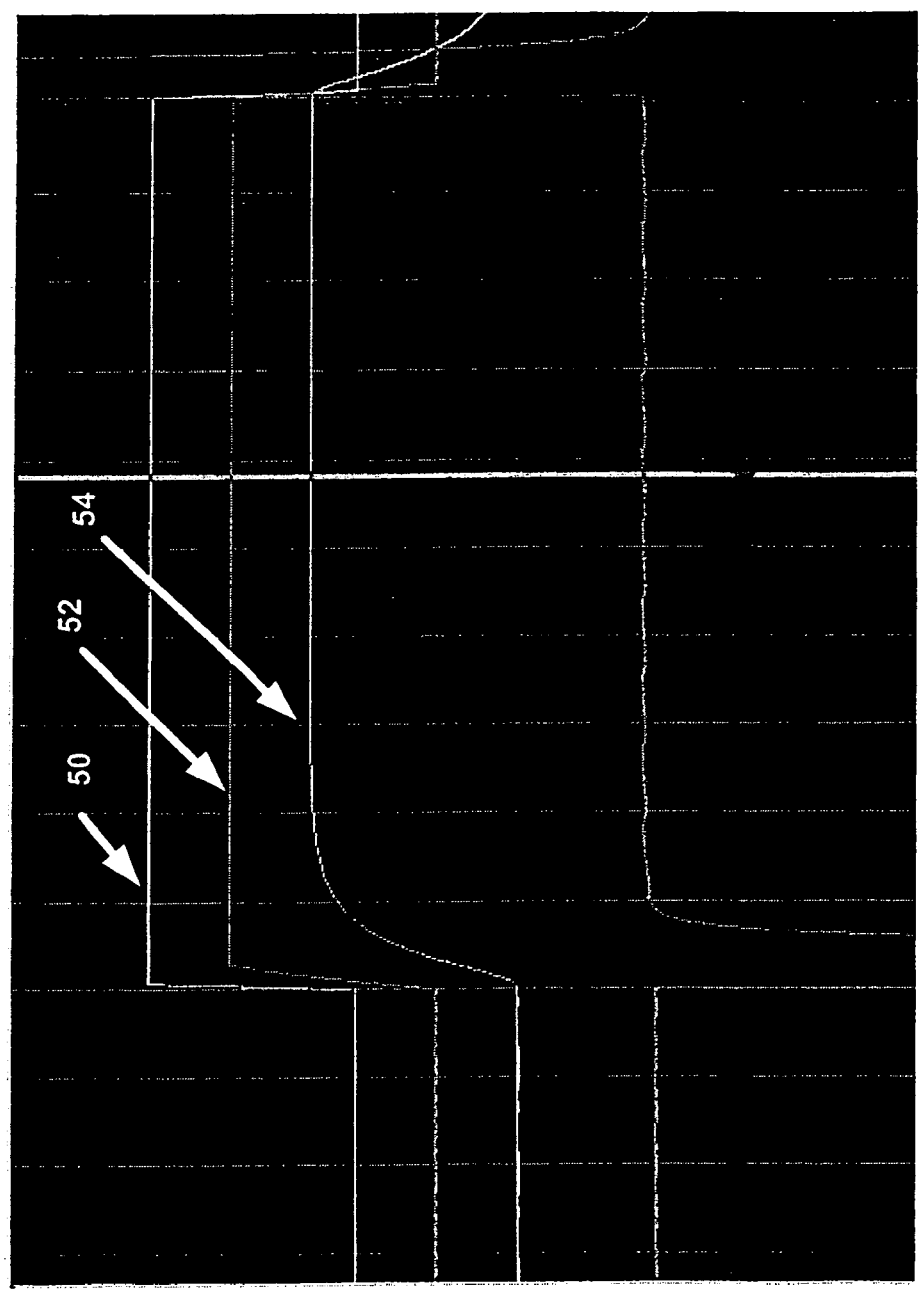
FIG. 3 shows a series of plots illustrating the performance of a DAC operating in accordance with the present invention and the performance of a conventional delta sigma Digital to Analog converter.

Referring now to FIG. 3, a first curve 50 corresponds to the response of a reference square wave, a second curve 52 corresponds to the response of a DAC provided in accordance with the present invention and a third curve 54 corresponds to the response of a Delta Sigma DAC.

By comparing the curves 50–54, it can be seen that curve 52 more closely follows the reference square wave 50 than does curve 54 and it can also be seen that the transient response characteristic of a DAC having an analog filter and a matched digital filter (i.e. curve 52) is improved with respect to the transient response characteristic of a conventional delta sigma DAC (i.e. curve 54). It should be noted that the curves in FIG. 3 were generated with circuits which clock the digital output at 50 MHz and use an RC filter with a time constant of 9 µs to filter the digital signal.

Thus, by matching the filter characteristic of the analog filter in the digital model 18 (FIG. 1), the transient response of a DAC provided in accordance with the present invention is improved when compared with the transient response of a conventional delta sigma DAC. As explained above, by utilizing the filter characteristic of the analog filter in a digital model (e.g. digital model 18, in FIG. 1) it is possible to cancel the RC characteristics of an analog filter (e.g. analog filter 20 in FIG. 1).

It can thus be seen that by providing a digital model of the analog filter 18 (FIG. 1) in the feedback loop and by matching the digital filter characteristics to the filter characteristics of the analog filter 20 (FIG. 1), a digital to analog converter which decreases the amount of noise and improves transient response is provided.

Figure 4:
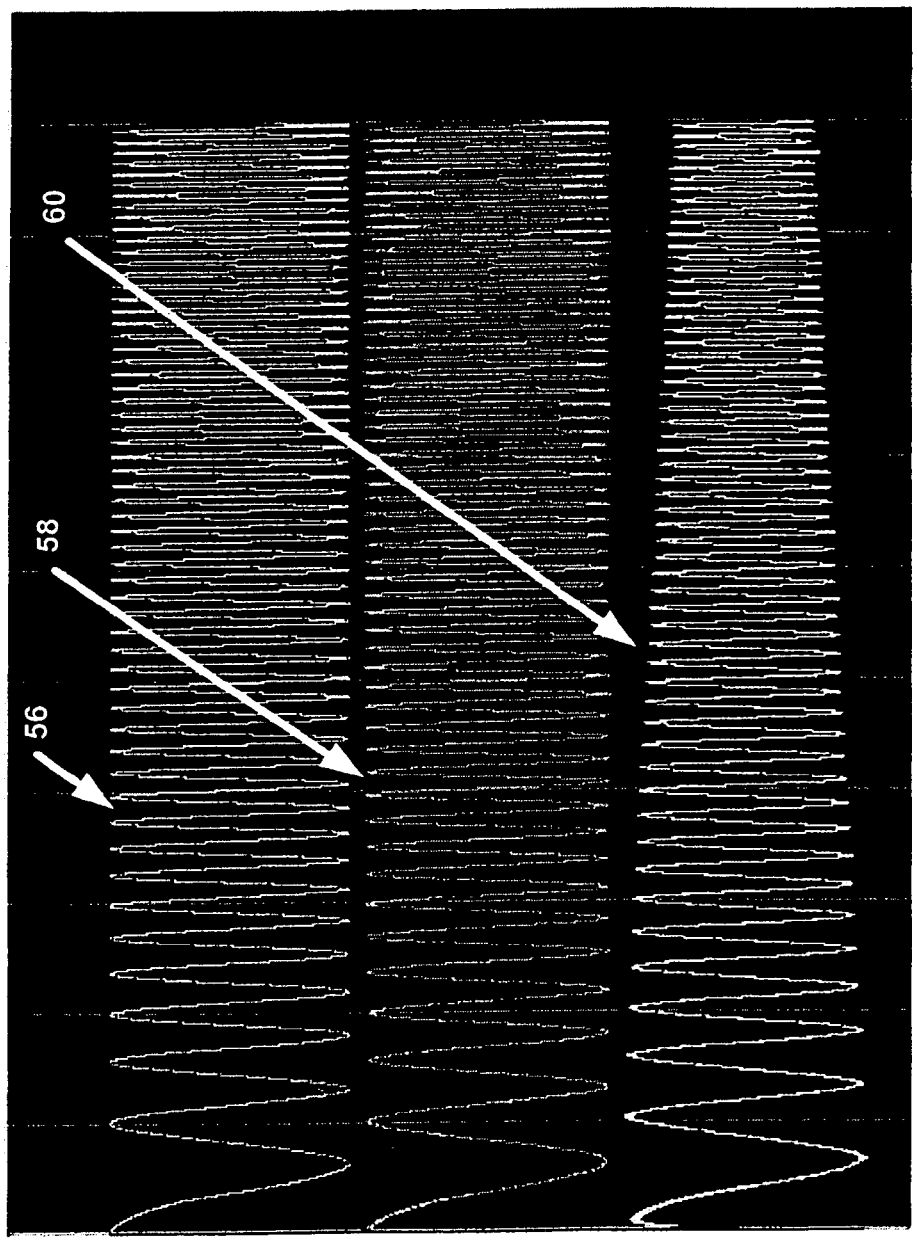
FIG. 4, shows a series of plots illustrating the chirp performance of a DAC operating in accordance with the present invention and the chirp performance of a conventional delta sigma Digital to Analog converter.

Referring now to FIG. 4, a first curve 56 corresponds to the response of a reference chirp, a second curve 58 corresponds to the response of a DAC provided in accordance with the present invention and a third curve 60 corresponds to the response of a Delta Sigma DAC.

Although the invention is sometimes described hereinabove in the context of circuit operations being performed on voltage signals, it should be appreciated that the same principles would apply if the circuit were operating on current signals. For example the comparator, digital model of the analog filter and the analog filter could each be implemented in circuits which operate on current signals rather than on voltage signals. Alternatively still, a circuit could be implemented which operates on both voltage and current signals.

All publications and references cited herein are expressly incorporated herein by reference in their entirety.

Having described the preferred embodiments of the invention, it will now become apparent to one of ordinary skill in the art that other embodiments incorporating their concepts may be used. It is felt therefore that these embodiments should not be limited to disclosed embodiments but rather should be limited only by the spirit and scope of the appended claims.

What is claimed is:

1. A digital to analog converter (DAC) comprising:
   a digital processor including:
      a comparator which receives a digital input signal and provides a digital output signal having a first value in response to a value of the digital input signal being less than a value of the feedback signal and having a second different value in response to a value of digital input signal being greater than a value of the feedback signal; and
      a digital implementation of an analog filter which receives the digital output signal from the comparator at an input thereof and provides the feedback signal to the comparator at an output thereof; and
   an analog filter having an input coupled to the output of the comparator and having an output coupled to an output of the DAC wherein a frequency response characteristic of the digital model of an analog filter substantially corresponds to a frequency response characteristic of the analog filter.

2. The DAC of claim 1 wherein the digital model of the analog filter is provided having a filter characteristic which is substantially the same as the filter characteristic of the analog filter.

3. The DAC of claim 1 wherein the analog filter is provided having one of:
  a low pass filter characteristic;
  a high pass filter characteristic; and
  a bandpass filter characteristic.

4. The DAC of claim 3 wherein:
  in response to the value of the digital input signal being greater than the value of the digital feedback signal, the digital output signal is provided having a first value; and
  in response to the value of the digital input signal being less than the value of the digital feedback signal, the digital output signal is provided having a second different value.

5. A system for processing radar signals comprising:
  a digital comparator adapted to receive a first input digital signal at a first input port and adapted to receive a second input digital signal at a second input port and adapted to provide a digital output signal at an output port;
  a digital processing element adapted to receive signals from the output of said digital comparator with said digital processing element operating to model a filter characteristic of an analog filter and operating to generate a digital feedback signal which said digital processing element provides along a digital feedback signal path to the second input of the comparator such that said comparator compares the digital input signal to the digital feedback signal; and
  an analog filter having an input port adapted to receive a digital signal from the output of said digital comparator.

6. The system of claim 5 wherein:
  in response to the value of the digital input signal being greater than the value of the digital feedback signal, the digital output signal is provided having a first value; and
  in response to the value of the digital input signal being less than the value of the digital feedback signal, the digital output signal is provided having a second different value.

7. The system of claim 5 wherein the analog filter is provided having a low pass filter characteristic.

8. The system of claim 5 wherein the digital model of the analog filter is provided having a low pass filter characteristic.

9. A method for processing radar signals comprising:
  providing a digital input signal to a first input of a comparator;
  providing a digital feedback signal to a second input of the comparator with the digital feedback signal corresponding to an output signal provided by a digital model of an analog filter;
  comparing the digital input signal to the digital feedback signal; and
  providing a digital output signal from the output of the comparator to an input of an analog filter having filter characteristics substantially corresponding to the filter characteristics represented by the digital model of an analog filter.

10. The method of claim 9 further comprising filtering the digital output signal with an analog filter to provide an analog output signal.

11. The method of claim 10 wherein:
  in response to the value of the digital input signal being greater than the value of the digital feedback signal, providing the digital output signal having a first value; and
  in response to the value of the digital input signal being less than the value of the digital feedback signal, providing the digital output signal having a second different value.

12. The method of claim 11 wherein filtering the digital output signal with an analog filter to provide an analog output signal comprises filtering the digital output signal with an analog filter having a low pass filter characteristic to provide an analog output signal.

13. The method of claim 12 wherein filtering the digital output signal with an analog filter to provide an analog output signal comprises filtering the digital output signal with an analog filter having a high pass filter characteristic to provide an analog output signal.

14. The method of claim 12 wherein filtering the digital output signal with an analog filter to provide an analog output signal comprises filtering the digital output signal with an analog filter having a band pass filter characteristic to provide an analog output signal.

* * * * *

UNITED STATES PATENT AND TRADEMARK OFFICE
CERTIFICATE OF CORRECTION

PATENT NO. : 7,038,608 B1
APPLICATION NO. : 11/013950
DATED : May 2, 2006
INVENTOR(S) : Gilbert Page 1 of 1

It is certified that error appears in the above-identified patent and that said Letters Patent is hereby corrected as shown below:

Column 2, line 18 delete "proving" and replace with --providing--.

Column 2, line 19 delete "can be also be" and replace with --can also be--.

Column 3, line 40 delete "one's and zero's)." and replace with --ones and zeros).--.

Column 3, line 41 delete "one's" and replace with --ones--.

Column 4, line 14 delete "input-port 16c" and replace with --input port 16c--.

Column 4, line 17 "delete "register 22" and replace with --resister 22--.

Column 4, line 52 delete "can be also be" and replace with --can also be--.

Column 5, line 45 delete "greater that the" and replace with --greater than the--.

Column 6, line 17 delete "FIG.1) it is" and replace with --FIG. 1), it is--.

Signed and Sealed this

Sixth Day of November, 2007

JON W. DUDAS
*Director of the United States Patent and Trademark Office*